US005328798A

United States Patent [19]

McCarthy et al.

[11] Patent Number: 5,328,798

[45] Date of Patent: Jul. 12, 1994

[54] LAMINAR THERMAL IMAGING MEDIUM CONTAINING PHOTOHARDENABLE ADHESIVE LAYER AND POLYMERIC ELASTIC AND NON-BRITTLE BARRIER LAYER

[75] Inventors: Kenneth J. McCarthy, Duxbury; Robert J. Pusateri, Rochester, both of Mass.

[73] Assignee: Polaroid Corporation, Cambridge, Mass.

[21] Appl. No.: 57,613

[22] Filed: May 5, 1993

Related U.S. Application Data

[62] Division of Ser. No. 798,899, Nov. 27, 1991, Pat. No. 5,229,247.

[51] Int. Cl.[5] .......... G03F 7/09; G03F 7/34; G03C 1/805

[52] U.S. Cl. .......... 430/200; 430/253; 430/258; 430/259; 430/261; 430/273

[58] Field of Search .......... 430/253, 200, 258, 259, 430/261, 273, 270

[56] References Cited

U.S. PATENT DOCUMENTS 2,616,961 11/1952 Groak .
3,241,973 3/1966 Thommes .
3,257,942 6/1966 Ritzerfeld et al. .
3,340,086 9/1967 Groak .
3,396,401 8/1968 Honomura .
3,592,644 7/1971 Vrancken et al. .
3,632,376 1/1972 Newman .
3,770,438 11/1973 Celeste .
3,924,041 12/1975 Miyayama .
4,123,578 10/1978 Perrington et al. .
4,157,412 6/1979 Deneau .
4,252,879 2/1981 Inoue et al. .

FOREIGN PATENT DOCUMENTS 8804237 6/1988 PCT Int'l Appl. .
1156996 7/1969 United Kingdom .

*Primary Examiner*—Charles L. Bowers, Jr.
*Assistant Examiner*—Christopher G. Young
*Attorney, Agent, or Firm*—Louis G. Xiarhos

[57] ABSTRACT

A laminar thermal imaging medium, and a method of preparing same, are disclosed and include a photohardenable adhesive layer containing a photopolymerizable ethythenically unsaturated monomer, and a barrier layer for providing resistance to the diffusion of the polymerizable monomer therethrough to other layers of the thermal imaging medium. The barrier layer increases substantially the time period before which photohardening of the adhesive layer need be performed, during which time cutting and other manufacturing operations can be performed. The elastic and non-brittle character of the barrier layer provides improved durability of images prepared from the thermal imaging medium.

20 Claims, 1 Drawing Sheet

LAMINAR THERMAL IMAGING MEDIUM CONTAINING PHOTOHARDENABLE ADHESIVE LAYER AND POLYMERIC ELASTIC AND NON-BRITTLE BARRIER LAYER

This is a divisional of application Ser. No. 07/798,899, filed Nov. 27, 1991, now U.S. Pat. No. 5,229,247.

BACKGROUND OF THE INVENTION

This invention relates to a thermal imaging medium for the recordation of information. More particularly, it relates to a laminar imaging medium for the provision of a pair of images on respective first and second sheets thereof.

The provision of images by resort to media which rely upon the generation of heat patterns has been well known. Thermally imageable media are particularly advantageous inasmuch as they can be imaged without certain of the requirements attending the use of silver halide based media, such as darkroom processing and protection against ambient light. Moreover, the use of thermal imaging materials avoids the requirements of handling and disposing of silver-containing and other processing streams or effluent materials typically associated with the processing of silver halide based imaging materials.

Various methods and systems for preparing thermally generated symbols, patterns and other images have been reported. Examples of these can be found in U.S. Pat. No. 2,616,961 (issued Nov. 4, 1952 to J. Groak); in U.S. Pat. No. 3,257,942 (issued Jun. 28, 1966 to W. Ritzerfeld, et al.); in U.S. Pat. No. 3,396,401 (issued Aug. 6, 1968 to K. K. Nonomura); in U.S. Pat. No. 3,592,644 (issued Jul. 13, 1971 to M. N. Vrancken, et al.); in U.S. Pat. No. 3,632,376 (issued Jan. 4, 1972 to D. A. Newman); in U.S. Pat. No. 3,924,041 (issued Dec. 2, 1975 to M. Miyayama, et al.); in U.S. Pat. No. 4,123,578 (issued Oct. 31, 1978 to K. J. Perrington, et al.); in U.S. Pat. No. 4,157,412 (issued Jun. 5, 1979 to K. S. Deneau); in Great Britain Patent Specification 1,156,996 (published Jul. 2, 1969 by Pitney-Bowes, Inc.); and in International Patent Application No. PCT/US87/03249 of M. R. Etzel (published Jun. 16, 1988, as International Publication No. WO 88/04237.

In the production of a thermally actuatable imaging material, it may be desirable and preferred that an image-forming substance be confined between a pair of sheets in the form of a laminate. Laminar thermal imaging materials are, for example, described in the aforementioned U.S. Pat. Nos. 3,924,041 and 4,157,412 and in the aforementioned International Patent Application No. PCT/US87/03249. It will be appreciated that the sheet elements of a laminar medium will afford protection of the image-forming substance against the effects of abrasion, rub-off and other physical stimuli. In addition, a laminar medium can be handled as a unitary structure, thus, obviating the requirement of bringing the respective sheets of a two-sheet imaging medium into proper position in a printer or other apparatus used for thermal imaging of the medium material.

In the aforementioned International Patent Application No. PCT/US87/03249, there are described certain preferred embodiments of a high resolution thermal imaging medium, which embodiments include a porous or particulate image-forming substance (e.g., a layer of pigment and binder) confined in a laminate structure between a pair of sheets. Upon separation of the respective sheets, after laser exposure of portions or regions of the medium, a pair of complementary images is obtained. Among the laminar embodiments of International Patent Application No. PCT/US87/03249 are those which include: a first sheet transparent to image-forming radiation and having at least a surface zone or layer of polymeric material which is heat-activatable upon subjection of the medium to brief and intense radiation; a layer of porous or particulate image-forming substance thereon; and a second sheet laminated and adhesively secured to the first sheet.

Upon exposure of regions or portions of the medium to brief and intense image-forming radiation, and conversion of absorbed energy to heat for activation of the heat-activatable polymeric material, corresponding regions or portions of the image-forming substance are caused to be more firmly attached or locked to the first sheet. Abutting regions or portions of image-forming substance which are not subjected to such image-forming radiation are, upon separation of the first and second sheets, removed by the adhesive second sheet, for formation of an image complementary to the image on the first sheet. In preferred thermal imaging media of the aforecited International Application, a release layer is provided over the porous or particulate image-forming substance to facilitate proper separation of the respective first and second sheets and formation of the respective complementary images.

The respective images obtained by separating the sheets of an exposed thermal imaging medium having an image-forming substance confined therebetween, such as a laminar image medium of the type described in the aforecited International Application, may exhibit substantially different characteristics. Apart from the imagewise complementary nature of these images and the relation that each may bear as a "positive" or "negative" of an original, the respective images may differ in character. Differences may depend upon the properties of the image-forming substance, on the presence of and nature of additional layer(s) in the medium, and upon the manner in which such layers fail adhesively or cohesively upon separation of the sheets. Either of the pair of images may, for reasons of informational content, aesthetics or otherwise, be desirably considered the principal image. The principal image may, however, depending upon the aforementioned properties and modes of failure, exhibit decidedly inferior properties, such as poorer handling characteristics, durability and abrasion resistance, as compared with the complementary image of secondary importance.

In the production of thermal images from media having "first" and "second" sheets, of the type described in the aforementioned International Application, it will oftentimes be preferred, in the case of high density images, that the principal image be that which is formed on the second sheet by transfer of non-exposed regions of coated image-forming substance. It will be recognized that an alternative-is to form a high density image on the first (opposed) sheet by firmly attaching the image-forming substance in areas of exposure. This is the case because the medium provides complementary images and the desired high density image can be formed on either sheet by addressing the thermally actuatable medium according to which sheet shall bear the high density image. Formation of a high density image on the first sheet is, however, disadvantageous since the areas of high density are created in areas of exposure (by activation of a heat-activatable image-forming zone or layer) and large areas of image-forming substance require correspondingly large areas of laser actuation and energy utilization and highly accurate laser scanning and tracking. Errors in tracking will result in discontinuities (whiteness or voids) by failure to attach minute regions of image-forming substance and by their removal to the opposed (second) sheet upon separation of the sheets. Owing to the psychophysical nature of human vision, minute regions of lightness (voids) against an expansive darkness tend to be noticeable.

It will, thus, be preferred that a high density image be the result of the transfer in non-exposed regions of coated and continuous regions of image-forming material (with minimal or no discontinuities or coverage voids), rather than the result of firm connection of high density regions of imaging material by laser-actuated operation of the heat-activatable image-forming surface, where tracking errors increase the possibility of creating noticeable areas of discontinuity (whiteness) against the expansive high density region.

Inasmuch as the formation of a preferred image in non-exposed portions of image-forming substance will be the result of the removal of such substance from an opposed sheet with the aid of an adhesive sheet, the adhesive thereof will serve as a base for the image carried by the sheet. The nature of the adhesive, and especially its physical properties, may influence image quality and certain physical attributes of the image, such as the handling properties and durability of the image.

In the pending patent application of Neal F. Kelly and Eugene Langlais, U.S. Ser. No. 616,853, filed Nov. 21, 1990, there is disclosed and claimed an improved thermal imaging medium including a polymeric hardenable adhesive layer which in its unhardened condition serves to laminate the sheets of the medium into a unitary medium having a reduced tendency to delaminate upon subjection to physical stresses and which, upon subsequent hardening (curing), provides sufficient hardness to provide improvements in image handling and durability.

A hardenable adhesive layer of the type described in the aforementioned patent application U.S. Ser. No. 616,853 provides notable advantages. Certain deficiencies have, however, been observed. In this connection, it has been observed that depending upon the nature and composition of the hardenable adhesive, it may be necessary to effect the curing of the hardenable layer to a hardened layer within a predetermined time before permeation or diffusion of mobile or fugitive species in the unhardened layer is allowed to influence the proper functioning of other layers of the medium. For example, in the case of a hardenable adhesive composition comprising a macromolecular organic binder and a photopolymerizable ethylenically unsaturated monomer, prolongation of the required curing of the layer to a hardened and durable layer may allow polymerizable monomer to migrate or permeate to the release layer of the medium, with adverse affect on the properties (e.g., cohesivity) of the release layer. This, in turn, can adversely influence the proper and predetermined functioning of the release layer and reduce the quality of image formation.

There is a continuing need for improvements in thermal imaging media of the aforedescribed types and it will be appreciated that there will be considerable interest in a thermal imaging medium which can be manufactured with improved efficiency and latitude and which is capable of providing images of improved quality and durability.

SUMMARY OF THE INVENTION

It has been found that improved latitude in manufacture can be achieved in the production of a laminar thermal imaging medium of a type which includes a photohardenable adhesive layer having a mobile or fugitive photopolymerizable ethylenically unsaturated monomer therein. In addition, improvement in the durability of images produced from the imaging medium, by thermal exposure and separation of the respective sheets thereof, can also be realized. These improvements are realized by including in the laminar medium—in a position intermediate the photohardenable adhesive layer and a release layer of the medium—a polymeric layer having certain particular properties. Thus, there is included a polymeric layer which has barrier properties, i.e., resistance to the diffusion of polymerizable monomer therethrough, and which has an elastic and non-brittle character. The incorporation of an intermediate barrier layer during manufacture of the medium increases substantially the time period before which the photohardenable adhesive layer must be hardened (cured) by photopolymerization. Upon curing of the photohardenable adhesive layer to a hardened layer, the thermal imaging medium can be used for the production of a pair of complementary images having improved durability.

According to the present invention, there is provided a laminar thermal imaging medium, comprising, in order:

a first sheet transparent to image-forming radiation and having at least a surface zone or layer of polymeric material heat-activatable upon subjection of the thermal imaging medium to brief and intense radiation;

a layer of porous or particulate image-forming substance having cohesivity in excess of its adhesivity for said polymeric heat-activatable layer;

a release layer to facilitate separation of the thermal imaging medium into first and second images upon subjection of the thermal imaging medium to brief and intense radiation;

a polymeric elastic and non-brittle layer;

a photohardenable adhesive layer comprising a macromolecular organic binder and a photopolymerizable ethylenically unsaturated monomer, said layer being hardenable to a layer of sufficient hardness to provide a thermal imaging medium having a durable base for an image thereon in porous or particulate image-forming substance; and a second sheet adhesively bonded to said imaging medium by said photohardenable adhesive layer;

said polymeric elastic and non-brittle layer having resistance to the diffusion therethrough of said photopolymerizable ethylenically unsaturated monomer.

According to a method aspect of the present invention, there is provided a method of preparing a laminar thermal imaging medium which comprises the steps of:

providing a first element comprising a first sheet transparent to image-forming radiation and having at least a surface zone or layer of polymeric material heat-activatable upon subjection of said thermal imaging medium to brief and intense radiation, said element carrying, in order, a layer of porous or particulate image-forming substance having cohesivity in excess of its adhesivity for said polymeric heat-activatable layer; a release layer, and a polymeric elastic and non-brittle layer having resistance to the diffusion therethrough of a photopolymerizable ethylenically unsaturated monomer;

providing a second element comprising a second sheet carrying a layer of photohardenable adhesive comprising a macromolecular organic binder and a photopolymerizable ethylenically unsaturated monomer;

laminating said first and second elements, with the respective sheets thereof outermost, into a unitary laminar medium;

cutting said unitary laminar medium into individual laminar units of predetermined size; and photohardening said photohardenable adhesive layer of said laminar units into a durable polymeric layer.

For a fuller understanding of the nature and objects of the invention, reference should be had to the following description taken in conjunction with the accompanying drawings.

DETAILED DESCRIPTION OF THE INVENTION

The laminar imaging medium of the invention embodies a photohardenable polymeric adhesive layer which, during manufacture of the medium, effectively adheres the respective sheets thereof into a unitary laminate and which protects the medium against delamination occasioned by the stress of manufacturing (e.g., bending, cutting or slitting) operations. In addition, the medium includes a polymeric barrier layer which provides resistance to the diffusion therethrough of mobile or fugitive photopolymerizable monomer from the photohardenable adhesive layer which may adversely influence the proper functioning of other layers of the medium. The barrier layer, thus, extends the time period available for curing the photohardenable layer, provides manufacturing latitude and affords manufacturing efficiencies. During this extended time period, cutting, slitting and other manipulatory operations can be performed. The photohardenable adhesive layer is photohardened (cured) by subjecting the medium to ultraviolet radiation, to provide a laminar medium which is ready for thermal imaging, for example, by exposure to the brief and intense radiation of a laser. The nature of the thermal imaging medium, and the manufacture and use thereof in the production of images, will be better understood from the following detailed description taken in conjunction with the figures.

Figure 1:
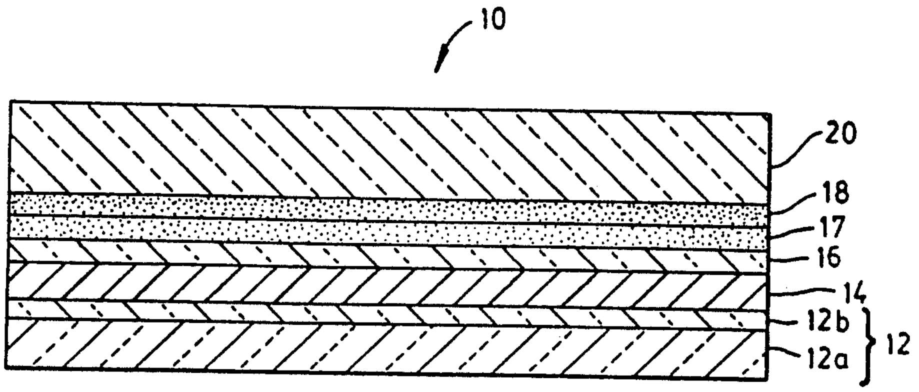
FIG. 1 is a diagrammatic cross-sectional view of a preferred laminar thermally actuatable imaging medium material of the invention.
Figure 2:
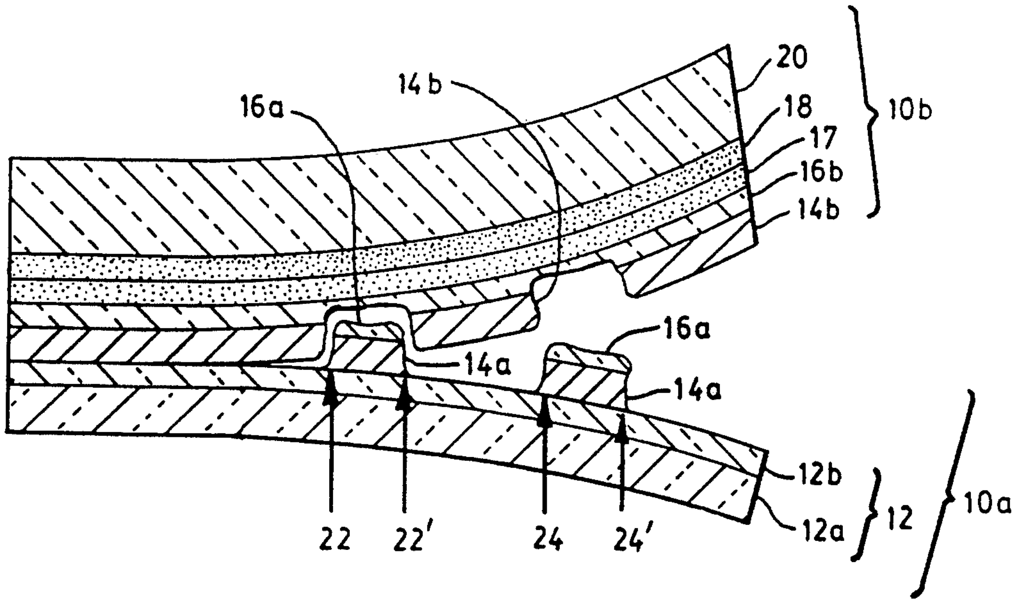
FIG. 2 is a diagrammatic cross-sectional view of the laminar imaging medium of FIG. 1, shown in a state of partial separation after thermal imaging.

In FIG. 1, there is shown a preferred laminar medium material of the invention suited to production of a pair of high resolution images, shown in FIG. 2 as images 10*a* and 10*b* in a partial state of separation. Thermal imaging medium 10 includes a first sheet material 12 (comprising sheet material 12*a* and heat-activatable zone or layer 12*b*) having superposed thereon, and in order, porous or particulate image-forming layer 14, release layer 16, polymeric barrier layer 17, photohardenable or photohardened polymeric adhesive layer 18 and second sheet 20.

In connection with FIG. 1, reference is made for convenience to a "photohardenable or photohardened" layer 18. It should be understood that layer 18 will be in an unhardened (but photohardenable) condition during a stage of the manufacture of a thermally imageable or thermally actuatable imaging medium material and that the layer will subsequently be photohardened (cured) to a durable layer as a prerequisite to usefulness of the medium material for image formation. Further, the exposure used for the photohardening of photohardenable layer 18 (typically a blanket UV exposure) should not be confused with the exposure used for the production of images from the thermally imageable or thermally actuatable medium material.

Imaging of medium material 10 provides, upon separation of the respective sheets, as shown in FIG. 2, a pair of images, 10*a* and 10*b*. The various layers of medium material 10 are described in detail hereinafter.

Sheet 12 comprises a transparent material so that image-forming radiation can be transmitted therethrough for the imaging of medium 10. Sheet 12 can comprise any of variety of sheet materials, although polymeric sheet materials will be especially preferred. Among preferred materials are polystyrene, polyethylene terephthalate, polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-co-acrylonitrile). An especially preferred sheet material from the standpoints of durability, dimensional stability and handling characteristics is polyethylene terephthalate.

Heat-activatable zone or layer 12*b* provides an essential function in the imaging of medium material 10 and comprises a polymeric material which is heat activatable upon subjection of the medium to brief and intense radiation, so that, upon rapid cooling, exposed portions of the surface zone or layer are firmly attached to porous or particulate image-forming layer 14. If desired, surface zone 12*b* can be a surface portion or region of sheet 12, in which case, layers 12*a* and 12*b* will be of the same or similar chemical composition. In general, it will be preferred that layer 12*b* comprise a discrete polymeric surface layer on sheet material 12*a*. Layer 12*b* will desirably comprise a polymeric material having a softening temperature lower than that of sheet material 12*a*, so that exposed portions of image-forming layer 14 can be firmly attached to web material 12(12*a*). A variety of polymeric materials can be used for this purpose, including polystyrene, poly(styrene-co-acrylonitrile), poly(vinyl butyrate), poly(methylmethacrylate), polyethylene and poly(vinyl chloride).

The employment of a thin heat-activatable layer 12*b* on a substantially thicker and durable web material 12*a* permits desired handling of web material 12 and desired imaging efficiency. The use of a thin heat-activatable layer 12*b* facilitates the concentration of heat energy at or near the interface between layers 12*b* and image-forming layer 14 and permits optimal imaging effects and reduced energy requirements. It will be appreciated that the sensitivity of layer 12*b* to heat activation (or softening) and attachment or adhesion to layer 14 will depend upon the nature and thermal characteristics of layer 12*b* and upon the thickness thereof.

Heat-activatable layer 12*b* can be provided on web material 12*a* by resort to known coating methods. For example, a layer of poly(styrene-co-acrylonitrile) can be applied to a sheet 12*a* of polyethylene terephthalate by coating from an organic solvent such as methylene chloride. In general, the desired handling properties of sheet material 12 will be influenced by the nature of sheet material 12*a* itself, inasmuch as layer 12*b* will be coated thereon as a thin layer. The thickness of sheet material 12 will depend upon the desired handling characteristics of medium material 10 during manufacture and during imaging and any post-imaging steps. Thickness will also be dictated in part by the intended use of the image to be carried thereon and by exposure conditions, such as the wavelength and power of the exposing source. Typically, sheet material 12 will vary in thickness form about 0.5 mil to seven mils (0.013 mm to 0.178 mm). Good results are obtained using, for example, a web material 12*a* having a thickness of about 1.5 to 1.75 mils (0.038 mm to 0.044 mm) carrying a layer 12*b* of poly(styrene-co-acrylonitrile) having a thickness of about 0.1 micron to five microns.

Heat-activatable layer 12*b* can include additives or agents providing known beneficial properties. Adhesiveness-imparting agents, plasticizers, adhesion-reducing agents, or other agents can be used. Such agents can be used, for example, to control adhesion between layers 12*b* and 14, so that, undesired separation at the interface thereof is minimized during manufacture of laminar medium 10 or during use thereof in a thermal imaging method or apparatus. Such control also permits the medium, after imaging and separation of sheets 12 and 20, to be partitioned in the manner shown in FIG. 2.

Image-forming layer 14 comprises an image-forming substance deposited onto heat-activatable zone or layer 12*b* as a porous or particulate layer or coating. Layer 14, also referred to as a colorant/binder layer, can be formed from a colorant material dispersed in a suitable binder, the colorant being a pigment or dye of any desired color, and preferably, being substantially inert to the elevated temperatures required for thermal imaging of medium 10. Carbon black is a particularly advantageous and preferred pigment material. Preferably, the carbon black material will comprise particles having an average diameter of about 0.1 to 10 micrometers (microns). Although the description hereof will refer principally to carbon black, other optically dense substances, such as graphite, phthalocyanine pigments and other colored pigments can be used. If desired, substances which change their optical density upon subjection to temperatures as herein described can also be employed.

The binder for the image-forming substance or layer 14 provides a matrix to form the porous or particulate substance thereof into a cohesive layer and serves to adhere layer 14 to heat-activatable zone or layer 12*b*. In general, it will be desired that image-forming layer 12*b* be adhered to surface zone or layer 12*b* sufficiently to prevent accidental dislocation either during the manufacture of medium 10 or during the use thereof. Layer 14 should, however, be separable (in non-exposed regions) from zone or layer 12*b*, after imaging and separation of sheets 12 and 20, so that partitioning can be accomplished in the manner shown in FIG. 2.

Image-forming layer 14 can be deposited onto surface zone or layer 12*b*, using known coating methods. According to one embodiment, and for ease in coating layer 14 onto zone or layer 12*b*, carbon black particles are initially suspended in an inert liquid vehicle (typically, water) and the resulting suspension or dispersion is uniformly spread over heat-activatable zone or layer 12*b*. On drying, layer 14 is adhered as a uniform image-forming layer on the surface thereof. It will be appreciated that the spreading characteristics of the suspension can be improved by including a surfactant, such as ammonium perfluoroalkyl sulfonate, nonionic ethoxylate or the like. Other substances, such as emulsifiers can be used or added to improve the uniformity of distribution of the carbon black in its suspended state and, thereafter, in its spread and dry state. Layer 14 can range in thickness and typically will have a thickness of about 0.1 micron to about 10 microns. In general, it will be preferred from the standpoint of image resolution, that a thin layer be employed. Layer 14 should, however, be of sufficient thickness to provide desired and predetermined optical density in the images prepared from imaging medium 10.

Suitable binder materials for image-forming layer 14 include gelatin, polyvinylalcohol, hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferably, the ratio of pigment to binder will be in the range of from about 4:1 to about 10:1. A preferred binder material for a carbon black pigment material is polyvinylalcohol.

If desired, additional additives or agents can be incorporated into image-forming layer 14. Thus, submicroscopic particles, such as chitin, polytetrafluoroethylene particles and/or polyamide can be added to colorant/binder layer 14 to improve abrasion resistance. Such particles can be present, for example, in amounts of from about 1:2 to about 1:20, particles to layer solids, by weight.

For the production of images of high resolution, it will be essential that image-forming layer 14 comprise materials that permit fracture through the thickness of the layer and along a direction substantially orthogonal to the interface between surface zone or layer 12*b* and image-forming layer 14, i.e., substantially along the direction of arrows 22, 22',24 and 24', shown in FIG. 2. It will be appreciated that, in order for images 10*a* and 10*b* to be partitioned in the manner shown in FIG. 2, imaging-forming layer 14 will be orthogonally fracturable as aforedescribed and will have a degree of cohesivity in excess of its adhesivity for heat-activatable zone or layer 12*b*. Thus, on separation of sheets 12 and 20 after imaging, layer 14 will separate in non-exposed areas from heat-activatable layer 12*b* and remain in exposed areas as porous or particulate portions 14*a* on sheet or web 12. Layer 14 is an imagewise disruptible layer owing to the porous or particulate nature thereof and the capacity for the layer to fracture or break sharply at particle interfaces.

Shown in FIG. 1, is release layer 16 which is included in thermal imaging medium 10 to facilitate separation of images 10*a* and 10*b* according to the mode shown in FIG. 2. As described hereinbefore, regions of medium 10 subjected to radiation become more firmly secured to heat-activatable zone or layer 12*b* by reason of the heat activation of the layer by the exposing radiation. Non-exposed regions of layer 14 remain only weakly adhered to heat-activatable zone or layer 12*b* and are carried along with sheet 20 on separation of sheets 12 and 20. This is accomplished by the adhesion of layer 14 to heat-activatable zone or layer 12*b*, in non-exposed regions, being less than: (a) the adhesion between layers 14 and 16; (b) the adhesion between layers 16 and 17; (c)

the adhesion between layers 17 and 18; (d) the adhesion between layer 18 and sheet 20; and (e) the cohesivity of layers 14, 16, 17 and 18. The adhesion of sheet 20 to porous or particulate layer 14, through layers 16, 17 and 18, while sufficient to remove non-exposed regions of porous and particulate layer 14 from heat-activatable zone or layer 12*b*, is controlled, in exposed areas, by release layer 16 so as to prevent removal of firmly attached exposed portions 14*a* of layer 14 (attached to heat-activated zone or layer 12*b* by exposure thereof).

Release layer 16 is designed such that its cohesivity or its adhesion to either barrier layer 17 or porous or particulate layer 14 is less, in exposed regions, than the adhesion of layer 14 to heat-activated zone or layer 12*b*. The result of these relationships is that release layer 16 undergoes an adhesive failure in exposed areas at the interface between layers 16 and 17, or at the interface between layers 14 and 16; or, as shown in FIG. 2, a cohesive failure of layer 16 occurs, such that portions (16*b*) are present in image 10*b* and portions (16*a*) are adhered in exposed regions to porous or particulate portions 14*a*. Portions 16*a* of release layer 16 serve to provide surface protection for the image areas of image 10*a*, against abrasion and wear.

Release layer 16 can comprise a wax, wax-like or resinous material. Microcrystalline waxes, for example, high density polyethylene waxes available as aqueous dispersions, can be used for this purpose. Other suitable materials include carnauba, beeswax, paraffin wax and was-like materials such as poly(vinylstearate), polyethylene sebacate, sucrose polyesters, polyalkylene oxides and dimethylglycol phthalate. Polymeric or resinous materials such as poly(methylmethacrylate) and copolymers of methyl methacrylate and monomers copolymerizable therewith can be employed. If desired, hydrophilic colloid materials, such as polyvinylalcohol, gelatin or hydroxyethyl cellulose can be included as polymer binding agents.

Resinous materials, typically coated as latexes, can be used and latices of poly(methyl methacrylate) are especially useful. Cohesivity of layer 16 can be controlled so as to provide the desired and predetermined fractioning. Waxy or resinous layers which are disruptible and which can be fractured sharply at the interfaces of particles thereof can be added to the layer to reduce cohesivity. Examples of such particulate materials include, silica, clay particles and particles of poly(tetrafluoroethylene).

As can be seen from FIG. 2, the relationships of adhesivity and cohesivity among the several layers of imaging medium 10 are such that separation occurs between layer 14 and heat-activatable zone or layer 12*b* in non-exposed regions. Thus, imaging medium 10, if it were to be separated without exposure, would separate between heat-activatable zone or layer 12*b* and layer 14 to provide a $D_{max}$ on sheet 20. The nature of image-forming layer 14 is such, however, that its relatively weak adhesion to heat-activatable zone or layer 12*b* can be substantially increased upon exposure. Thus, as shown in FIG. 2, exposure of medium 10 to brief and intense radiation in the direction of the arrows and in the areas defined by the respective pairs of arrows, serves in the areas of exposure to substantially lock or attach layer 14, as portions 14*a*, to heat-activatable zone or layer 12*b*.

Shown in FIGS. 1 and 2, over release layer 16, is polymeric barrier layer 17. The properties of barrier layer 17 contribute importantly to the manufacture of medium 10 and to the durability of image 10*b* produced therefrom. A principal function of barrier layer 17 is to provide resistance to the diffusion therethrough of fugitive or mobile species from unhardened (uncured) adhesive layer 18 which includes an ethylenically unsaturated photopolymerizable monomer. The migration of monomer from uncured layer 18 can influence the physical properties of release layer 16 and other layers of medium 10, for example, layer 14 of image-forming substance. In particular, where a barrier layer 17 is not in place, the cohesivity of release layer 16 can be altered by prolonged contact of uncured layer 18 with release layer 16 during the manufacture of medium 10, with consequent impairment of the desired partitioning shown in FIG. 2. This dictates that cutting, slitting and other manufacturing operations be performed efficiently and within a short and predetermined time period, i.e., before migration of monomeric or other fugitive species to release layer 16 is allowed to adversely affect desired imaging. Typically, where an uncured adhesive layer 18 (carried by sheet 20) is placed into direct contact with release layer 16 for production of medium 10, i.e., without a barrier layer 17 being present, such manipulatory operations will be performed immediately and before one hour, and preferably within about five minutes.

The employment of a barrier layer 17 between release layer 16 and uncured adhesive layer 18 prolongs substantially the time before which the curing of layer 18 must be performed to avoid adverse and unacceptable influence of fugitive or mobile species on the proper functioning (imaging) of medium 10, as shown in FIG. 2. Typically, the available time between lamination and completion of those operations which are desirably performed before needed curing of adhesive layer 18 will be about one hour to about 24 hours.

Good barrier properties can be obtained using a layer 17 of polyvinylidene chloride or a copolymerizable ethylenically unsaturated monomer. Commercially available polymeric materials suited to use herein as a barrier layer 17 include those available under the trade designations of Daran (W.R. Grace & Company) and Geon (The B.F. Goodrich Company).

In the production of medium 10, a preferred practice is to provide first and second elements, the first element comprising sheet 12 (carrying layers 14, 16 and 17) and the second element comprising sheet 20 (carrying uncured adhesive layer 18); and to, then, laminate the elements with their respective sheets outermost into a unitary laminate. This procedure enables good contact between layers 17 and 18 and provides a substantially uniform bonding therebetween. The lamination can be performed under ambient room temperature, or with added heat. In general, good results are obtained by laminating at temperatures of from about 70° F. to about 115° F., i.e., about 21° C. to about 46° C.

Barrier layer 17 can be provided onto release layer 16 by any of a variety of known coating methods. In the case of a preferred polyvinylidene chloride barrier material, a latex of the polymer can be coated onto an element comprising sheet 12 and layers 14 and 16. The layer is then dried and laminated to sheet 20 carrying layer 18 of photohardenable adhesive.

While a principal function of layer 17 is to provide barrier properties, other properties of layer 17 provide additional benefits in medium 10. As can be seen from FIG. 2, and from image 10*b* in particular, hardened layer 18, barrier layer 17 and portions 16*b* of release layer 16 serve as a base for portions 14*b* of image-forming substance. The handling properties of image 10*b* and the durability thereof will, thus, be influenced by the nature of each such layer, by the adhesion between the respective interfaces of such layers and, in particular, by the adhesion of photohardened layer 18 to support 20. Barrier layer 17 comprises a polymer having elastic and non-brittle properties. It has been found that images in the nature of image 10*b*, but which do not include barrier layer 17, may exhibit a tendency toward mechanical instability, in that, bending or flexing of the image may cause image portions 14*b* to separate or detach in flake-like form from sheet 20. This separation or detachment has been observed to occur principally at the interface of photohardened layer 18 and sheet 20. The incorporation into medium 10 of a barrier layer of polymeric material having elastic and non-brittle properties improves markedly the mechanical stability and durability of image 10*b*.

It can be seen from FIGS. 1 and 2 that barrier layer 17 serves to adhere release layer 16 and photohardened layer 18 to one another and may, thus, be considered a tie coat or tie layer which serves to bond layers 16 and 18 to one another. It has been found, however, that barrier layer 17, although not in direct contact with sheet 20 improves the adhesion of photohardened layer 18 to the support (sheet 20) with which it is in contact and reduces markedly the tendency of image-forming substance to be detached at the interface of layer 18 and sheet 20. While applicants do not wish to be bound by any precise theory or mechanism in explanation of the improved image durability promoted by the presence of barrier layer 17 in medium 10, it is believed that there may be involved such factors as absorption by layer 17 of physical stresses that otherwise would promote a delamination at the interface of photohardened layer 18 and sheet 20, the capacity of elastic and non-brittle layer 17 to compress or elongate upon application of such stresses and the relative softness of elastic and non-brittle layer 17 in relation to photohardened and durable layer 18.

Suitable elastic and non-brittle polymeric materials for barrier layer 17 include polyvinylide chloride and the copolymers of vinylidene chloride and a copolymerizable ethylenically unsaturated monomer. Suitable copolymerizable monomers include the alkyl acrylates, acrylic acid, acrylonitrile, butadiene and styrene. Other suitable polymeric materials for barrier layer 17 include nitrocellulose, polyvinyl acetal, fluoroelastomers, styrene-butadiene copolymers such as styrene-butadiene copolymeric latex containing additional copolymerized units such as acrylic, itaconic or crotonic acid or other copolymerized units which promote latex stability and the carboxylated styrene-butadiene latices. It will be understood that the properties of barrier layer 17, and especially the softness and elasticity thereof, may be influenced by contact of layer 17 with uncured layer 18 and that desired elasticity may be promoted in some instances to the extent that monomer from layer 18 permeates into and plasticizes layer 17.

The thickness of barrier layer 17 can vary with the particular nature and constituency thereof and with the barrier and elastic qualities thereof. In general, layer 17 will have a thickness of about 1.5 to about 3 microns, and preferably, from 2 to 2.5 microns.

Shown in medium 10 is a second sheet 20, laminated to image-forming layer 14, through adhesive layer 18, barrier layer 17 and release layer 16. Sheet 20 provides the means by which non-exposed areas of image-forming layer 14 can be carried from sheet 12 in the form of portions 14*b* of image 10*b*, as shown in FIG. 2.

Adhesive layer 18 of medium 10 comprises a hardenable adhesive layer which protects the medium during manufacture against stresses that would create a delamination of the medium, typically, in the case of medium 10 of FIG. 1, at the interface between zone or layer 12*b* and image-forming layer 14. The physical stresses which tend to promote delamination and which are alleviated by hardenable layer 18 vary and include stresses created by bending the laminar medium and those created by winding, unwinding, cutting, slitting or stamping operations. It will be appreciated that individual (formatted) film units of predetermined size, and suited, for example, to stacking in a cassette for feeding into a printer apparatus, will be of particular interest. Such film units can be prepared by preparing an endless web of medium material having the arrangement of layers shown in FIG. 1 and, then, cutting individual units of predetermined size from the web supply. A reciprocal stamping and cutting operation, for example, creates stresses in a medium material of the type shown in FIG. 1 and may induce a delamination of the medium at the interface thereof having the weakest adhesivity. The use in such a medium of a photopolymerizable and unhardened layer 18 to alleviate the effects of such stresses markedly improves manufacturing efficiencies.

According to a method aspect of the invention, medium 10 will be prepared by the lamination of first and second sheet elements or components. A first element or component comprises sheet 12 carrying image-forming layer 14, release layer 16 and barrier layer 17 coated onto release layer 16 for bonding of the element to a second element or component which comprises sheet 20 carrying hardenable adhesive layer 18. The respective elements can be laminated under pressure, and optionally under heating conditions, to provide a unitary and laminar medium 10 of the invention. Laminar medium 10 can then be subjected to stress-inducing manipulatory or processing steps with minimized tendency toward delamination. A reciprocal stamping and cutting or slitting operation, which in the absence of a layer 18 would tend to delaminate the medium, can be performed to advantage. A photopolymerization step, for the hardening of hardenable layer 18, can then be performed to provide a durable base layer 18 for the provision of an imaging medium which upon thermal exposure and separation of sheets 12 and 20 provides a durable image 10*b*.

Suitable compositions for adhesive layer 18 contain a polymeric binder and a polymerizable ethylenically unsaturated monomer which can, by addition polymerization, be polymerized to a high molecular weight polymer. For example, acrylate and methacrylate esters of polyhydric alcohols such as pentaerythritol or trimethylolpropane can be cross-linked by ultraviolet irradiation using a photoinitiator such as an acetophenone derivative, benzoin or an alkyl-substituted anthraquinone. Other suitable initiators include azobisisobutyronitrile and azo-bis-4-cyano-pentanoic acid, although others can be employed. Cross-linking agents of the difunctional type, such as divinylbenzene, can also be used, to promote cross-linking via the unsaturated moieties of a polymerizable monomer and the cross-linking agent.

Among preferred compositions for layer 18 are compositions containing: a macromolecular organic binder;

a photopolymerizable ethylenically unsaturated monomer having at least one terminal ethylenic group capable of forming a high polymer by free-radical initiated, chain-propagated addition polymerization; and a free-radical generating, addition polymerization-initiating system activatable by actinic radiation. Suitable macromolecular binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose ethers (e.g., methyl, ethyl and benzyl cellulose); synthetic rubbers (e.g., butadiene/acrylonitrile copolymers; chlorinated isoprene and chloro-2-butadiene-1,3-polymers); polyvinyl esters (e.g., polyvinyl acetate/acrylate copolymers, polyvinyl acetate and polyvinyl acetate/methylmethacrylate copolymers); polyacrylate and polyalkylacrylate esters (e.g., polymethymethacrylate); and polyvinyl chloride copolymers (e.g., vinyl chloride/vinylacetate copolymers).

Suitable photopolymerizable ethylenically unsaturated monomers for such compositions include the difunctional and trifunctional acrylates, such as the aforementioned acrylate and methacrylate esters of polyhydric alcohols (e.g., pentaerythritol triacrylate and trimethylolpropane triacrylate). Other suitable monomers include ethylene glycol diacrylate or dimethacrylate or mixtures thereof; glycerol diacrylate or triacrylate; urethane acrylates; and epoxy acrylates. In general, photopolymerizable monomers which provide tack in such compositions or which serve to plasticize the macromolecular binder will be preferred.

An especially preferred adhesive composition includes an acrylic macromolecular binder and a photopolymerizable trimethylolpropane triacrylate monomer and a photoinitiator. The photopolymerizable monomer serves to tackify the binder material and to permit production of a pressure-sensitive and tacky adhesive layer. Cutting and slitting operations can be performed after lamination and, upon curing, a hard layer is obtained.

In general, hardenable layer 18 can be coated as a thin to viscous layer. Preferably, a relatively viscous layer will be preferred from the standpoints of coating and handling and control of layer thickness, without loss of material by being pressed from within the laminate. Antioxidants can be included, if desired. Thickeners, binders and coating aids can be included to control viscosity and facilitate coating to a uniform and adhesive layer. Tack-promoting and pasticizing agents can be included for their known properties.

Photohardening of adhesive layer 18 can be accomplished in known manner by polymerization, using conventional sources of ultraviolet radiation such as carbon arc lamps, "D" bulbs, Xenon lamps and high pressure mercury lamps. The choice of a suitable irradiating source for hardening will also depend on the thickness of the layer to be hardened.

The thickness of hardenable polymeric layer can vary and, in general, will be in the range from 0.1 to 50 microns. A preferred range of thickness is from 0.5 to 20 microns.

It will be appreciated that the photohardening of layer 18, and particularly the degree thereof, may reduce the further capacity of layer 18 to be absorptive of stress conditions or to otherwise prevent an unwanted delamination. Unhardened (hardenable) layer 18 can, however, be used to advantage during manufacture of medium 10 to minimize undesired delamination. After hardening, the medium can be packaged, handled and processed in a printer or other apparatus for imaging. If desired, the degree of photohardening can be controlled such that hardening is substantially complete while still retaining a degree of softness to provide protection against delamination.

As is known in the art, photopolymerization systems are oftentimes sensitive to atmospheric oxygen. The use of photopolymerizable compositions as aforedescribed and which are sensitive to oxygen can be used to advantage. Individually cut units of medium 10 tend, at the edgemost regions of layer 18 about the perimeter of the laminar medium, to be incompletely polymerized and to retain a degree of softness which reduces the tendency for the medium to delaminate.

If desired, medium 10 can include an auxiliary layer to provide protection against the delamination of the medium. Such a layer will be preferred where rigorous physical stresses may be applied to the medium and where photohardenable layer 18 may not provide sufficient protection thereagainst. Thus, a stress-absorbing layer (not shown) can be incorporated between layers 12*a* and 12*b*, and, upon hardening of hardenable layer 18, stress-absorbing functionality is present in the medium for protection against undesired delamination. A compressible or elongatable polyurethane layer can be used as such a stress-absorbing layer and is described in U.S. Pat. No. 5,200,297 issued Apr. 16, 1993.

Upon curing of adhesive layer 18, medium material 10 is ready for imaging. Attachment of weakly adherent image-forming layer 14 to heat-activatable zone or layer 12*b* in areas of exposure is accomplished by absorption of radiation within the imaging medium and conversion to heat sufficient in intensity to heat activate zone or layer 12*b* and on cooling to more firmly join exposed regions or portions of layer 14 to heat-activatable zone or layer 12*b*. Thermal imaging medium 10 is capable of absorbing radiation at or near the interface of heat-activatable zone or layer 12*b*. This is accomplished by using layers in medium 10 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

If desired, porous or particulate image-forming substance 14 can comprise a pigment or other colorant material such as carbon black which, as is more completely described hereinafter, is absorptive of exposing radiation and which is known in the thermographic imaging field as a radiation-absorbing pigment. Inasmuch as a secure bonding or joining is desired at the interface of layer 14 and heat-activatable zone or layer 12*b*, it may be preferred in some instances that a light-absorbing substance be incorporated into either or both of image-forming layer 14 and heat-activatable zone or layer 12*b*.

Suitable light-absorbing substances in layers 14 and/or 12*b*, for converting light into heat, include carbon black, graphite or finely divided pigments such as the sulfides or oxides of silver, bismuth or nickel. Dyes such as the azo dyes, xanthene dyes, phthalocyanine dyes or the anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811 (issued Apr. 2, 1985 to D. J. Gravesteijn, et al.), and including 1,3-bis[2,6-di-t-butyl-4H-thiopyran-4-ylidene)methyl]-2,4-dihydroxy-dihydroxidecyclobutene diylium-bis(inner salt). Other suitable IR-absorbing dyes include 4-[7-(4H-pyran-4-ylide)hepta-1,3,5-trienyl]pyrylium tetraphenylborate and 4-[[3-[7-diethylamino-2-(1,1-dimethylethyl)-benz[b]-4H-pyran-4-ylidene)methyl]-2-hydroxy-4-oxo-2-cyclobuten-1-ylidene]methyl]-7-diethylamino-2-(1,1-dimethylethyl)-benz[b]pyrylium hydroxide inner salt. These and other IR-absorbing dyes are disclosed in the commonly assigned patent application of Z. J. Hinz, et al., entitled Heptamethine Pyrylium Dyes, and Processes for their Preparation and Use as Near Infra-Red Absorbers, U.S. Ser. No. 616,651, filed Nov. 21, 1990; and in the commonly assigned and copending application of S. J. Telfer, et al., entitled Benzpyrylium Squarylium Dyes, and Processes for Their Preparation and Use, U.S. Ser. No. 616,639, filed Nov. 21, 1990.

Thermal imaging laminar medium 10 can be imaged by creating (in medium 10) a thermal pattern according to the information imaged. Exposure sources capable of providing radiation which can be directed onto medium 10, and which can be converted by absorption into thermal energy, can be used. Gas discharge lamps, Xenon lamps and lasers are examples of such sources.

The exposure of medium 10 to radiation can be progressive or intermittent. For example, a two-sheet laminar medium, as shown in FIG. 1, can be fastened onto a rotating drum for exposure of the medium through sheet 12. A light spot of high intensity, such as is emitted by a laser, can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in an imagewise and predetermined manner to thereby record information according to an original to be imaged. As is shown in FIG. 2, a pattern of intense radiation can be directed onto medium 10 by exposure to a laser from the direction of the arrows 22 and 22' and 24 and 24', the areas between the respective pairs of arrows defining regions of exposure.

If desired, a thermal imaging laminar medium of the invention can be imaged using a moving slit or stencils or masks, and by using a tube or other source which emits radiation continuously and which can be directed progressively or intermittently onto medium 10. Thermographic copying methods can be used, if desired.

Preferably, a laser or combination of lasers will be used to scan the medium and record information in the form of very fine dots or pels. Semiconductor diode lasers and YAG lasers having power outputs sufficient to stay within upper and lower exposure threshold values of medium 10 will be preferred. Useful lasers may have power outputs in the range of from about 40 milliwatts to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which are capable of providing a beam sufficiently fine to provide images having resolution as fine as one thousand (e.g., 4,000–10,000) dots per centimeter.

Locally applied heat, developed at or near the interface of image-forming layer 14 and heat-activatable zone or layer 12*b* can be intense (about 400° C.) and serves to effect imaging in the manner aforedescribed. Typically, the heat will be applied for an extremely short period, preferably in the order of <0.5 microsecond, and exposure time span may be less than one millisecond. For instance, the exposure time span can be less than one millisecond and the temperature span in exposed regions can be between about 100° C. and about 1000° C.

Apparatus and methodology for forming images from thermally actuatable media such as the medium of the present invention are described in detail U.S. Pat. No. 5,170,261, issued Dec. 8, 1992 to E. B. Cargill, et al.; and in U.S. Pat. No. 5,221,971, issued Jun. 22, 1993 to J. A. Allan, et al.

The imagewise exposure of medium 10 to radiation creates in the medium latent images which are viewable upon separation of the sheets thereof (12 and 20) as shown in FIG. 2. Sheet 20 can comprise any of a variety of plastic materials transmissive of actinic radiation used for the photohardening of photohardenable adhesive layer 18. A transparent polyester (e.g., polyethylene terephthalate) sheet material is preferred. In addition, sheet 20 will preferably be corona treated to promote the adhesion thereto of photohardened and durable layer 18. Preferably, each of sheets 12 and 20 will be flexible polymeric sheets.

Since image 10*b*, by reason of its informational content, aesthetics or otherwise, will oftentimes be considered the principal image of the pair of images formed from medium material 10, it may be desired that the thickness of sheet 20 be considerably greater and more durable than sheet 12. In addition, it will normally be beneficial from the standpoints of exposure and energy requirements that sheet 12, through which exposure is effected, be thinner than sheet 20. Asymmetry in sheet thickness may increase the tendency of the medium material to delaminate during manufacturing or handling operations. Utilization of photohardenable adhesive layer 18 will be preferred in medium 10 particularly to prevent delamination during manufacture of the medium.

If desired, further protection for the image 10*b* against abrasion and added durability can be achieved by including an additional layer (not shown) of a thermoplastic material intermediate image-forming layer 14 and surface zone or layer 12*b*, which additional layer comprises a polymeric disruptible layer fracturable substantially along the exposure direction and which provides surface protective portions (over image portions 14*b*) for improved durability of image 10*b*. A laminar thermal imaging medium including a thermoplastic intermediate layer to provide surface protection of an image prepared therefrom is disclosed and claimed in U.S. Pat. No. 5,155,003 issued Oct. 13, 1992, to Chang.

Alternatively, additional durability can be provided to image 10*b* by depositing a protective polymeric overcoat layer thereon. A protected image and method therefor are disclosed and claimed in the now abandoned patent application of A. Fehervari, et al., entitled, Protected Image, and Process for the Production Thereof, U.S. Ser. No. 616,851, filed Nov. 21, 1990.

The following examples are presented for purposes of illustrating the invention but are not to be taken as limiting the invention. All parts, ratios and proportions, except where otherwise indicated, are by weight.

EXAMPLE 1

Onto a first sheet of polyethylene terephthalate of 1.75-mil (0.044 mm) thickness were deposited the following layers in succession:

a 2.5-micron thick stress-absorbing layer of polyurethane (ICI XR-9619, ICI Resins US, Wilmington, Mass.);

a 0.9-micron thick heat-activatable layer of poly(styrene-co-acrylonitrile);

a one-micron thick layer of carbon black pigment, polyvinylalcohol (PVA), styrenated acrylate dispersing agent (Joncryl 67, from Johnson Wax Company, Racine, Wis.) and 1,4-butanediol diglycidyl ether, at ratios, respectively, of 5/1/0.5/0.18;

a one-micron thick release layer comprising silica, PVA, styrenated acrylate latex particles (from Joncryl 87, Johnson Wax Company, Racine, Wis.), sodium salt of copolymer of maleic anhydride and vinyl methyl ether (Gantrez S-97, Mol. Wt. approximately 100,000, GAF Corporation), and ammonium perfluoroalkyl sulfonate surfactant (FC-120, Minnesota Mining and Manufacturing Company), at ratios, respectively, of 30/21/2/0.6/0.2; and a 2.5-micron thick layer comprising a terpolymer of vinylidene chloride, acrylic acid and acrylonitrile (90% vinylidene chloride, Daran SL-112 aqueous emulsion, 54% solids. from WR Grace Company) and dioctyl ester of sodium sulfosuccinic acid (surfactant, Aerosol-OT, Air Products and Chemicals, Inc.), at ratios, respectively of 70.2/1.

Onto a second sheet of polyethylene terephthalate, of seven-mil (0.178 mm) thickness, was deposited a layer of ultraviolet (UV)-curable adhesive. The UV-curable adhesive was formulated by adding 50 parts of trimethylolpropane triacrylate monomer (TMPTA), available as Sartomer 351 from Sartomer Company, West Chester, Pa., to a solution containing: 11 parts poly(methylmethacrylate-co-isobutylmethacrylate), available as Elvacite 2045 from E. I. dupont de Nemours and Company; 240 parts of 50% solution of acrylic polymer in toluene, available as Doresco RAC-102-19 from Dock Resin Company; 0.1 part methoxyhydroquinone; 14 parts of 2.2-dimethoxy-2-phenylacetophenone, available as Irgacure 651 from Ciba Geigy Co.; and 0.7 part of a 50/50 blend of antioxidants, Irganox 1010 and Irganox 1035 (respectively, tetrakis{methylene(3,5-di-tert-butyl-4-hydroxhydrocinnamate)}methane and thiodiethylene bis-(3,5-di-tert-butyl-4 hydroxy) hydrocinnamate, each available from Ciba Geigy Company). The resulting formulation was dissolved in a solvent blend of 657 parts ethylacetate and 27 parts methyl ethyl ketone.

A layer of the resulting UV-curable composition was coated onto the aforedescribed polyethylene terephthalate sheet and the sheet was traversed through an oven at about 185° F. for removal of solvent and was impinged with air and dried. The UV-curable adhesive was a pressure-sensitive adhesive having a thickness of about 17 microns and a tacky nature in its uncured condition.

The first and second polyethylene terephthalate sheets were immediately brought into face-to-face contact, the seven-mil sheet being in contact with a heated rotating steel drum (35°-38° C.). A rubber roll having a Durometer hardness of 70-80 was pressed against the 1.75-mil web material. The resulting web of laminar medium was wound onto a take-up roll (1.75-mil web material outermost) for flattening of the medium material and unwound to a slitting station where edgewise trimming along both edges of the medium was performed in the machine direction. The laminar medium was punch-cut to individual units. The individual units (separated from the surround, sent to waste) were passed under a radio frequency powered source of ultraviolet radiation, with the seven-mil sheet of each unit facing the source at a distance of about 2.5 inches (6.4 cm) from the source (a Model DRS-111 Deco Ray Conveyorized Ultraviolet Curing System, Fusion UV Curing Systems, Rockville, Md.).

Individual units of medium prepared as described in this example were imaged by laser exposure (through the 1.75-mil of the polyester sheet thereof) using high intensity semiconductor lasers. In each case, the laminar medium was fixed (clamped) to a rotary drum with the seven-mil polyester component thereof facing the drum. The radiation of semiconductor lasers was directed through the 1.75-mil polyester sheet thereof in an imagewise manner in response to a digital representation of an original image to be recorded in the thermally actuatable medium. After exposure to the high-intensity radiation (by scanning of the imaging medium orthogonally to the direction of drum rotation) and removal of the thus-exposed imaging medium from the drum, the respective sheets of the imaging elements were separated to provide a first image on first 1.75-mil polyester sheet and a second (and complementary) image on the second (7-mil) polyester sheet (the principal image).

EXAMPLE 2

A laminar thermal imaging material was prepared in the manner described in EXAMPLE 1, except that, the following composition was employed, in lieu of the UV-curable composition thereof, for production of a UV-curable adhesive layer:

| Ingredients | Parts by Weight |
|---|---|
| Sartomer 351 | 107 |
| Elvacite 2045 | 66 |
| Doresco RAC-102-19 | 135 |
| Irgacure 651 | 14 |
| Irganox 1110 and 1035 (50/50) | 0.7 |
| Methoxyhydroquinone | 0.1 |
| Ethylacetate | 649 |
| Methyl ethyl ketone | 27 |

Individual film units were punch cut, UV cured, imaged and separated, all in the manner described in EXAMPLE 1, to provide, in each instance, first and second images on the respective sheets thereof.

COMPARATIVE EXAMPLE

A Laminar thermal imaging material was prepared in the manner described in Example 1, except that, a 2.5-micron thick layer of 75 parts poly(methylmethacrylate-co-ethylmethacrylate) having a Tg of 45° C., available as Hycar-26256 latex from the B.F. Goodrich Company, and 1.0 part sodium fluoroalkylsulfonate was applied onto the release layer as a "bridge" adhesive layer, in lieu of the 2.5 micron thick layer of terpolymer (Daran) described in EXAMPLE 1. Individual film units were punch cut, UV cured, imaged and separated, all in the manner described in EXAMPLE 1 to provide first and second images on the respective first and second sheets thereof.

The resulting images carried by the second sheet were evaluated for durability and compared with the corresponding images provided by the film units of EXAMPLE 1, using the following test. Images were bent around a series of steel rods of progressively smaller diameter. In each case, the support side of the image was in contact with the steel rod as the image was flexed thereagainst. Attention was directed to the image side for observation of any flaking (i.e., detachment) of image substance from the image substrate. Rods having a diameter range of from 0.5 inch to 0.125 inch (12.7 mm to 3.17 mm), and varying incrementally by 1/16 inch (1.59 mm), were employed in the test.

Images provided by the film units of EXAMPLE 1 were flexed about a rod of ¼ inch diameter (6.35 mm) without flaking and showed minor detachment when the rod diameter was reduced to 3/16 inch (4.76 mm). Images provided by the CONTROL EXAMPLE showed minor flaking of image material using a rod of ½ inch (12.7 mm) diameter and substantial flaking with a 7/16 inch (11.11 mm) steel rod. The images of EXAMPLE 1 were adjudged, owing to the elasticity of the terpolymer layer thereof in contrast to the relatively brittle nature of the corresponding "bridge" adhesive layer, to be markedly superior in durability.

What is claimed:

1. A laminar thermal imaging medium comprising an image-forming substance confined between a pair of sheets, said laminar medium comprising in order:

a first sheet transparent to said image-forming radiation and having at least a surface zone or layer of polymeric material heat-activatable upon subjection of said thermal imaging medium to brief and intense radiation;

a layer of porous or particulate image-forming substance having cohesivity in excess of its adhesivity for said polymeric heat-activatable layer;

a release layer to facilitate separation of the thermal imaging medium into first and second images, each in said porous or particulate image-forming substance, upon subjection of the thermal imaging medium to brief and intense radiation and separation of the respective sheets of the medium;

a polymeric elastic and non-brittle layer;

a photohardenable adhesive layer comprising a macromolecular organic binder and a photopolymerizable ethylenically unsaturated monomer, said layer being hardenable to a layer of sufficient hardness to provide a durable base for an image thereon in said porous or particulate image-forming substance; and a second sheet adhesively bonded to said laminar thermal imaging medium by said photohardenable adhesive layer;

said polymeric elastic and non-brittle layer having resistance to diffusion therethrough to said release layer of said photopolymerizable ethylenically unsaturated monomer of said photohardenable adhesive layer;

said imaging medium being imageable upon subjection to said brief and intense radiation and being capable of absorbing said radiation and of converting said radiation to heat sufficient in intensity to activate said heat-activatable polymeric material for attachment of said porous or particulate image-forming substance firmly to said first sheet in areas of exposure to said radiation, said polymeric material upon being heated and subsequently cooled being effective to attach said porous or particulate image-forming substance in said areas to or through an intermediate layer to said first sheet.

2. The laminar thermal imaging medium of claim 1 wherein said photohardenable adhesive layer comprises a macromolecular organic binder; a photopolymerizable ethylenically unsaturated monomer having at least one terminal ethylenic group capable of forming a high molecular weight polymer by free radical-initiated, chain-propagated addition polymerization; and a free radical-generating, addition polymerization-initiating system activatable by actinic radiation.

3. The laminar thermal imaging medium of claim 2 wherein said polymeric elastic and non-brittle layer is contiguous with each of said release layer and said photohardenable adhesive layer.

4. The laminar thermal imaging medium of claim 3 wherein said polymeric elastic and non-brittle layer is a barrier layer having resistance to the diffusion therethrough to said release layer of mobile or fugitive species present in said photohardenable adhesive layer.

5. The laminar thermal imaging medium of claim 4 wherein said polymeric elastic and non-brittle barrier layer comprises polymerized repeating vinylidene chloride units.

6. The laminar thermal imaging medium of claim 5 wherein said polymeric elastic and non-brittle barrier layer includes copolymerized repeating units from an ethylenically unsaturated monomer copolymerizable with vinylidene chloride.

7. The laminar thermal imaging medium of claim 6 wherein said polymeric elastic and non-brittle barrier layer has a thickness of from about 1.5 to about 3 microns.

8. The laminar thermal imaging medium of claim 7 wherein said layer of porous or particulate image-forming substance comprises a layer of carbon black pigment uniformly distributed through a binder of polyvinylalcohol.

9. The laminar thermal imaging medium of claim 8 wherein said release layer is adapted to facilitate said separation by cohesive failure of said layer on separation of the respective sheets of said medium.

10. The laminar thermal imaging medium of claim 9 wherein said release layer comprises silica in a binder of polyvinylalcohol.

11. The laminar thermal imaging medium of claim 10 wherein said surface zone or layer of heat-activatable polymeric material comprises a thin layer of polymeric material having a softening temperature lower than that of said first sheet.

12. The laminar thermal imaging medium of claim 11 wherein said thin layer of polymeric material comprises poly(styrene-co-acrylonitrile).

13. The laminar thermal imaging medium of claim 12 wherein said photohardenable adhesive layer is photohardenable to a durable layer by ultraviolet irradiation.

14. The laminar thermal imaging medium of claim 13 wherein each of said first and second sheets comprises polyethylene terephthalate.

15. A laminar thermal imaging medium comprising an image-forming substance confined between a pair of sheets, said laminar medium comprising in order:

a first sheet transparent to said image-forming radiation and having at least a surface zone or layer of polymeric material heat-activatable upon subjection of said thermal imaging medium to brief and intense radiation;

a layer of porous or particulate image-forming substance having cohesivity in excess of its adhesivity for said polymeric heat-activatable layer;

a release layer to facilitate separation of the thermal imaging medium into first and second images, each in said porous or particulate image-forming substance, upon subjection of the thermal imaging medium to brief and intense radiation and separation of the respective sheets of the medium;

a polymeric elastic and non-brittle layer;

a photohardened adhesive layer obtained by photohardening a photohardenable layer comprising a macromolecular organic binder and a photopolymerizable ethylenically unsaturated monomer, said photohardened adhesive layer being of sufficient hardness to provide a durable base for an image thereon in said porous or particulate image-forming substance; and a second sheet adhesively bonded to said laminar thermal imaging medium by said photohardenable adhesive layer;

said polymeric elastic and non-brittle layer having resistance, prior to said photohardening, to diffusion therethrough to said release layer of said photopolymerizable ethylenically unsaturated monomer of said polyhardenable layer;

said imaging medium being imageable upon subjection to said brief and intense radiation and being capable of absorbing said radiation and of converting said radiation to heat sufficient in intensity to activate said heat-activatable polymeric material for attachment of said porous or particulate image-forming substance firmly to said first sheet in areas of exposure to said radiation, said polymeric material upon being heated and subsequently cooled being effective to attach said porous or particulate image-forming substance in said areas to or through an intermediate layer to said first sheet.

16. The laminar thermal imaging medium of claim 15 wherein said photohardenable adhesive layer comprises a macromolecular organic binder, a photopolymerizable ethylenically unsaturated monomer having at least one terminal ethylenic group capable of forming a high molecular weight polymer by free radical-initiated, chain-propagated addition polymerization; and a free radical-generating, addition polymerization-initiating system activatable by actinic radiation.

17. The laminar thermal imaging medium of claim 16 wherein said polymeric elastic and non-brittle layer is contiguous with each of said release layer and said photohardened adhesive layer and has resistance to the diffusion therethrough to said release layer of mobile or fugitive species present in said photohardenable adhesive layer.

18. The laminar thermal imaging medium of claim 17 wherein said polymeric elastic and non-brittle barrier layer comprises polymerized repeating vinylidene chloride units.

19. The laminar thermal imaging medium of claim 17 wherein said release layer comprises silica in a binder of polyvinylalcohol.

20. The laminar thermal imaging medium of claim 15 wherein said photohardened adhesive layer is photohardened to said durable layer by ultraviolet irradiation.

* * * * *